United States Patent
Kato et al.

(10) Patent No.: US 12,051,591 B2
(45) Date of Patent: Jul. 30, 2024

(54) SEMICONDUCTOR DEVICE

(71) Applicant: FUJI ELECTRIC CO., LTD., Kawasaki (JP)

(72) Inventors: Yoshiharu Kato, Matsumoto (JP); Toru Ajiki, Matsumoto (JP); Takashi Yoshimura, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 420 days.

(21) Appl. No.: 17/456,570

(22) Filed: Nov. 24, 2021

(65) Prior Publication Data

US 2022/0084826 A1 Mar. 17, 2022

Related U.S. Application Data

(63) Continuation of application No. PCT/JP2020/046587, filed on Dec. 14, 2020.

(30) Foreign Application Priority Data

Dec. 17, 2019 (JP) ................................. 2019-227139

(51) Int. Cl.
*H01L 29/06* (2006.01)
*H01L 21/265* (2006.01)

(52) U.S. Cl.
CPC ........ *H01L 21/265* (2013.01); *H01L 29/0692* (2013.01)

(58) Field of Classification Search
CPC ........................... H01L 21/265; H01L 29/0692
See application file for complete search history.

(56) References Cited

U.S. PATENT DOCUMENTS

| 6,482,681 B1 | 11/2002 | Francis |
| 2008/0001257 A1* | 1/2008 | Schulze ............... H01L 29/861 257/E29.2 |
| 2010/0244093 A1 | 9/2010 | Rahimo |
| 2013/0249058 A1 | 9/2013 | Neidhart |

(Continued)

FOREIGN PATENT DOCUMENTS

| DE | 102018132236 A1 | 6/2020 |
| DE | 112019000094 T5 | 9/2020 |

(Continued)

OTHER PUBLICATIONS

Office Action issued for counterpart German Application 112020002227.7, issued by the German Patent and Trademark Office on Dec. 22, 2022.

(Continued)

*Primary Examiner* — Samuel A Gebremariam

(57) ABSTRACT

Provided is a semiconductor device comprising: a semiconductor substrate; a plurality of peaks of a doping concentration provided on a back surface of the semiconductor substrate; and a flat part, with a doping concentration more than or equal to 2.5 times a substrate concentration of the semiconductor substrate, provided between the plurality of peaks in a depth direction of the semiconductor substrate, wherein at least one of the plurality of peaks is a first peak provided on a front surface side relative to the flat part, wherein a doping concentration of the first peak is less than or equal to twice the doping concentration of the flat part.

20 Claims, 10 Drawing Sheets

(56) References Cited

U.S. PATENT DOCUMENTS

| | | |
|---|---|---|
| 2014/0246750 A1 | 9/2014 | Takishita |
| 2015/0179441 A1 | 6/2015 | Onozawa |
| 2016/0141399 A1 | 5/2016 | Jelinek |
| 2017/0018434 A1 | 1/2017 | Onozawa |
| 2017/0271447 A1 | 9/2017 | Tamura |
| 2017/0352730 A1 | 12/2017 | Nakamura |
| 2018/0012762 A1 | 1/2018 | Mukai |
| 2018/0130875 A1 | 5/2018 | Suzuki |
| 2018/0166279 A1 | 6/2018 | Tamura |
| 2018/0366566 A1 | 12/2018 | Suzuki |
| 2019/0067462 A1 | 2/2019 | Tamura |
| 2020/0194550 A1 | 6/2020 | Baburske |
| 2020/0194562 A1 | 6/2020 | Yoshimura |
| 2022/0084826 A1 | 3/2022 | Kato |

FOREIGN PATENT DOCUMENTS

| | | |
|---|---|---|
| JP | 2010541266 A | 12/2010 |
| JP | 2018078216 A | 5/2018 |
| JP | 2019009148 A | 1/2019 |
| WO | 2013089256 A1 | 6/2013 |
| WO | 2014065080 A1 | 5/2014 |
| WO | 2016051970 A1 | 4/2016 |
| WO | 2016120999 A1 | 8/2016 |
| WO | 2016204227 A1 | 12/2016 |
| WO | 2017047285 A1 | 3/2017 |
| WO | 2017146148 A1 | 8/2017 |
| WO | 2018092788 A1 | 5/2018 |
| WO | 2019181852 A1 | 9/2019 |
| WO | 2021125140 A1 | 6/2021 |

OTHER PUBLICATIONS

International Search Report and (ISA/237) Written Opinion of the International Search Authority for International Patent Application No. PCT/JP2020/046587, mailed by the Japan Patent Office on Mar. 9, 2021.

\* cited by examiner

SEMICONDUCTOR DEVICE

The contents of the following Japanese patent application(s) are incorporated herein by reference:
NO. 2019-227139 filed in JP on Dec. 17, 2019, and
NO. PCT/JP2020/046587 filed in WO on Dec. 14, 2020

BACKGROUND

1. Technical Field

The present invention relates to a semiconductor device.

2. Related Art

Conventionally, a semiconductor device comprising a buffer region functioning as a field stop is known (for example, see Patent Document 1).

PRIOR ART DOCUMENT

Patent Document

[Patent Document 1] U.S. Patent Application Publication No. 2016/0141399

DESCRIPTION OF EXEMPLARY EMBODIMENTS

Figure 1A:
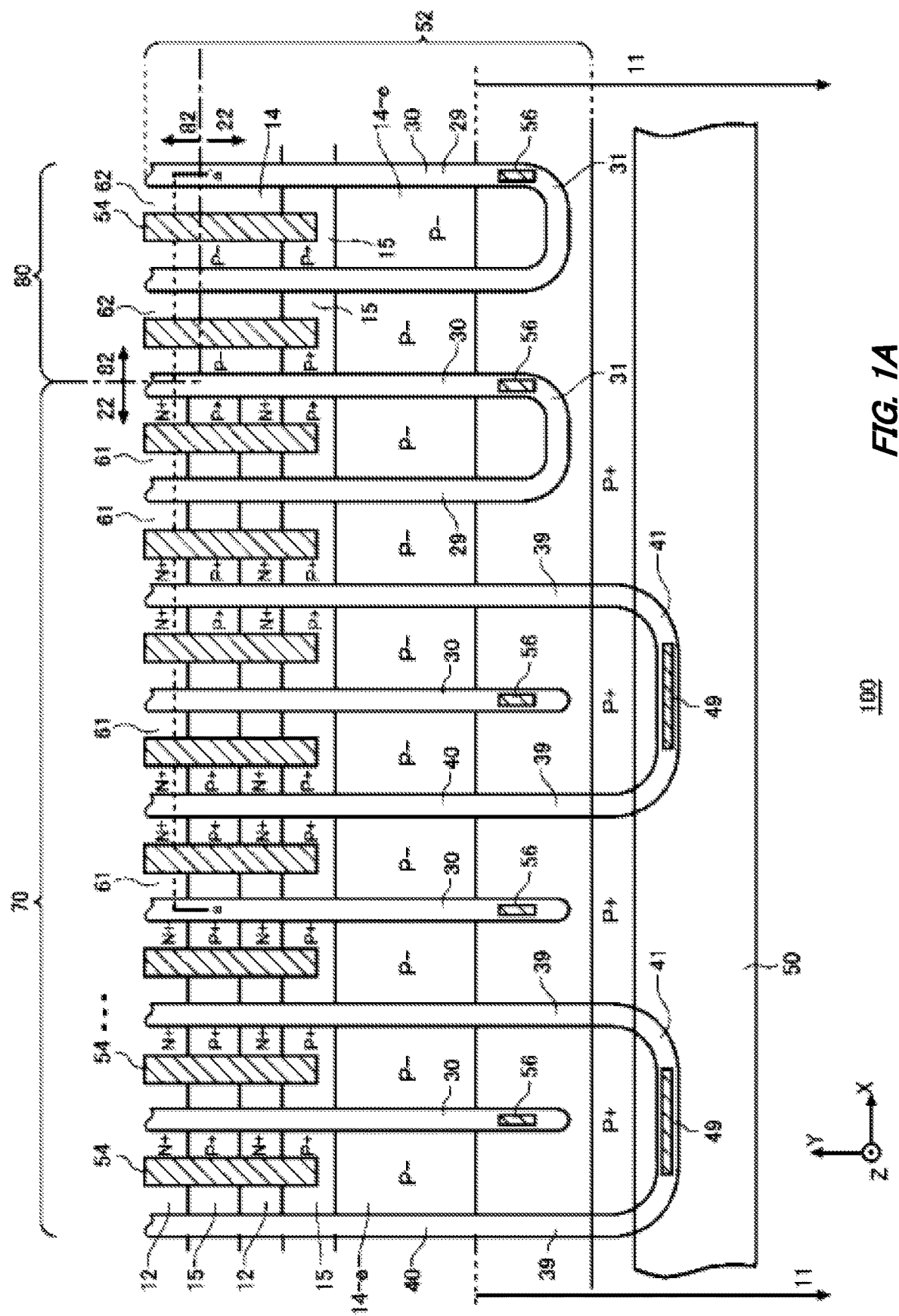
FIG. 1A shows one example of a configuration of a semiconductor device 100 according to an example embodiment.

Hereinafter, the present invention will be described through embodiments of the invention, but the following embodiments do not limit the invention according to claims. In addition, not all of the combinations of features described in embodiments are essential to the solving means of the invention.

As used herein, one side in a direction parallel to a depth direction of a semiconductor substrate is referred to as "upper", and the other side is referred to as "lower". One surface of two principal surfaces of a substrate, a layer or some other member is referred to as a front surface, and the other surface is referred to as a back surface. The "upper", "lower", "front", and "back" directions are not limited to the gravitational direction or the direction of attachment to a substrate or the like at the time of mounting of a semiconductor device.

As used herein, technical matters may be described using orthogonal coordinate axes of an X-axis, a Y-axis and a Z-axis. As used herein, a surface parallel to a front surface of a semiconductor substrate is referred to as an XY surface, and a direction, which forms a right-handed system with the X-axis and the Y-axis and is the depth direction of the semiconductor substrate, is referred to as the Z-axis. Additionally, as used herein, the view of the semiconductor substrate in the Z-axis direction is referred to as a planar view.

Although, in each example embodiment, a first conductivity type is exemplified as N type, and a second conductivity type is exemplified as P type, the first conductivity type may be P type, and the second conductivity type may be N type. In this case, the conductivity type of substrate, layers, regions and the like in each example embodiment respectively are of the opposite polarity.

A donor has a function of supplying electrons to a semiconductor. An acceptor has a function of receiving electrons from a semiconductor. The donor and the acceptor are not limited to the impurities themselves. For example, a VOH defect which is a combination of a vacancy (V), oxygen (O), and hydrogen (H), which exist in the semiconductor, serves as a donor for supplying electrons.

In this specification, it is meant that each of an electron or a hole is a majority carrier in a layer or a region labeled n or p. Also, '+' and '−', which are attached to 'n' and 'p', respectively mean that the layers and the regions are with a doping concentration higher and lower than those without '+' and '−'. In this specification, a unit system is the SI base unit system unless otherwise particularly noted. Although a unit of length is represented using cm, it may be converted to meters (m) before calculations.

As used herein, a chemical concentration refers to an atom concentration of an element measured regardless of an electrical activation state. The chemical concentration can be measured by, for example, the Secondary Ion Mass Spectrometry (SIMS) method. As used herein, a concentration per unit is represented by using atoms/cm$^3$ or /cm$^3$. This unit is used for a chemical concentration in a semiconductor substrate, or a donor or acceptor concentration. A notation of atoms may be omitted. Each concentration herein may be a value at room temperature. By way of example, a value at 300K (Kelvin) (about 26.9 degrees C.) may be used as the value at room temperature.

As used herein, a doping concentration refers to a concentration of a donor or acceptorized dopant. For the unit of the doping concentration, /cm$^3$ is used, as with the chemical concentration. As used herein, a difference of concentrations of a donor and an acceptor (i.e., a net doping concentration) may be taken as the doping concentration. The net doping concentration can be measured by the capacitance-voltage method (CV method). Alternatively, a carrier concentration which can be measured by the spreading resistance method (srp method may be taken as the net doping concentration. The carrier concentration measured by the CV method or the srp method may be taken as a value in a thermal equilibrium state. Also, as the doping concentration, a chemical concentration of a donor and an acceptor may be used. In this case, the doping concentration can be measured by the SIMS method. If not particularly limited, any of the above may be used as the doping concentration. If not particularly limited, a peak value of a doping concentration distribution in a doping region may be taken as the doping concentration in the doping region.

If a concentration distribution of a donor, an acceptor, or a net doping has a peak in a region, the value of the peak may be taken as the concentration of the donor, the acceptor, or the net doping in the region. If a concentration distribution of a donor, an acceptor, or a net doping is approximately uniform or the like in a region, the average value of the concentration of the donor, the acceptor, or the net doping in the region may be taken as the concentration of the donor, the acceptor, or the net doping.

The concentration of the donor or the acceptor calculated from the carrier concentration measured by the CV method or the srp method may be lower than the chemical concentration of the element indicating the donor or the acceptor. By way of example, in a silicon semiconductor, a donor concentration of phosphorous or arsenic, as a donor, or an acceptor concentration of boron, as an acceptor, is about 99% or more than 99% of its chemical concentration.

In addition, as used herein, a dosage refers to the number of ions implanted in a wafer per unit area when ions are implanted. Therefore, the unit is /cm$^2$. Note that a dosage of a semiconductor region can be taken as an integrated concentration which is obtained by integrating doping concentrations across the semiconductor region in the depth direction. The unit of the integrated concentration is /cm$^2$. Therefore, the dosage may be treated as the same as the integrated concentration. The integrated concentration may also be an integral value within a half-value width. In the case of being overlapped by spectrum of another semiconductor region, the integrated concentration may be derived without the influence of another semiconductor region.

Therefore, as used herein, the level of the doping concentration can be read as the level of the dosage. In other words, if the doping concentration of one region is higher than the doping concentration of another region, it can be understood that the dosage of said one region is higher than the dosage of said another region.

In the semiconductor substrate 10 described below, hydrogen ions are implanted. In the semiconductor substrate 10, a lattice defect made up mostly of vacancies, such as single atomic vacancies (V) and divacancies (VV), is formed due to a passing through of hydrogen in a pass-through region, where hydrogen ions have passed. An atom adjacent to a vacancy has a dangling bond. As used herein, when a lattice defect is referred to, it may include a lattice defect made up mostly of vacancies, and may also include an interstitial atom and dislocation, etc., and in a broad sense may include a donor and an acceptor.

In the whole semiconductor substrate 10, oxygen is included. The oxygen is intentionally or unintentionally introduced at the time of manufacturing an ingot of the semiconductor. Inside the semiconductor substrate 10, hydrogen (H), vacancies (V), and oxygen (O) are attached to form a VOH defect. Also, by heat treating the semiconductor substrate 10, hydrogen is diffused, which facilitates the formation of the VOH defect. The VOH defect serves as the donor which supplies an electron. As used herein, the VOH defect may merely be referred to as a hydrogen donor. The doping concentration of the hydrogen donor is lower than the chemical concentration of hydrogen. For example, in a silicon semiconductor, if the rate of the doping concentration of the hydrogen donor to the chemical concentration of hydrogen is taken as an activation ratio, the activation ratio may be a value from 0.1% to 30%. Although a chemical concentration of a bulk donor at the time of manufacturing the semiconductor substrate 10 varies relatively considerably, the dosage of the hydrogen ion can be controlled with a relatively high precision. Thus, the concentration of the lattice defect caused by implanting the hydrogen ion can also be controlled with a high precision, which enables the donor concentration of the pass-through region to be controlled with a high precision.

FIG. 1A shows one example of a configuration of a semiconductor device 100 according to an example embodiment. The semiconductor device 100 of the present example is a semiconductor chip including a transistor portion 70 and a diode portion 80. For example, the semiconductor device 100 is a reverse conducting IGBT (RC-IGBT).

The transistor portion 70 is a region where a collector region 22 provided on the back surface side of the semiconductor substrate 10 is projected onto a front surface 21 of the semiconductor substrate 10. The collector region 22 has the second conductivity type. The collector region 22 of the present example is of P+ type, by way of example. The transistor portion 70 includes a transistor such as an IGBT.

The diode portion 80 may be a region where a cathode region 82 is projected onto the front surface 21 of the semiconductor substrate 10. The diode portion 80 includes a diode such as a free wheel diode (FWD) provided adjacent to the transistor portion 70 on the front surface 21 of the semiconductor substrate 10.

FIG. 1A shows a surrounding region of a chip end portion, which is an edge side of the semiconductor device 100, and the other regions are omitted. For example, in the region on the negative side of the X-axis direction of the semiconductor device 100 of the present example, an edge termination structure portion may be provided. The edge termination structure portion reduces the electric field strength on the front surface 21 side of the semiconductor substrate 10. The edge termination structure portion includes, for example, a guard ring, a field plate or a RESURF, and combined structure thereof. Note that, in the present example, although the negative edge of the X-axis direction will be described for convenience, similar descriptions can be applied to the other edges of the semiconductor device 100.

The semiconductor substrate 10 is a silicon substrate. The semiconductor substrate 10 of the present example is a MCZ substrate, which is manufactured by the Magnetic field applied Czochralski (MCZ) method. The MCZ substrate is suitable for manufacturing a wafer of a larger caliber when compared to a FZ substrate according to the FZ (Floating Zone) method.

The semiconductor device 100 of the present example includes a gate trench portion 40, a dummy trench portion 30, a well region 11, an emitter region 12, a base region 14 and a contact region 15 on the front surface 21 of the semiconductor substrate 10. In addition, the semiconductor device 100 of the present example includes an emitter electrode 52 and a gate metal layer 50 provided above the front surface 21 of the semiconductor substrate 10.

The emitter electrode 52 and the gate metal layer 50 are manufactured of a metal-containing material. For example, at least a partial region of the emitter electrode 52 may be manufactured of aluminum, aluminum-silicon alloy, or aluminum-silicon-copper alloy. At least a partial region of the gate metal layer 50 may be manufactured of aluminum, aluminum-silicon alloy, or aluminum-silicon-copper alloy.

The emitter electrode 52 and the gate metal layer 50 may have a barrier metal manufactured of titanium, a titanium compound or the like in a layer underlying a region formed of aluminum or the like. The emitter electrode 52 and the gate metal layer 50 are provided separately from each other.

The emitter electrode 52 and the gate metal layer 50 are provided above the semiconductor substrate 10 with an interlayer dielectric film interposed therebetween. The interlayer dielectric film is omitted in FIG. 1A. In the interlayer dielectric film, a contact hole 49, a contact hole 54, and a contact hole 56 are provided such that they penetrate the interlayer dielectric film.

The contact hole 49 connects the gate metal layer 50 with a gate conductive portion 44 in the gate trench portion 40. The gate conductive portion 44 will be described below. Inside the contact hole 49, a plug formed of tungsten or the like may be formed.

The contact hole 56 connects the emitter electrode 52 with a dummy conductive portion 33 in a dummy trench portion 30. The dummy conductive portion 33 will be described below. Inside the contact hole 56, a plug formed of tungsten or the like may be formed.

Gate trench portions 40 are arrayed at a predetermined interval along a predetermined array direction (the X-axis direction in the present example). The gate trench portion 40 of the present example may include two extending portions 39 and a connecting portion 41 which connects the two extending portions 39, wherein the extending portions 39 extend along the extending direction (the Y-axis direction in the present example), parallel with the front surface 21 of the semiconductor substrate 10 and perpendicular to the array direction.

At least a part of the connecting portion 41 is preferably formed in a curved shape. By connecting the end portions of the two extending portions 39 of the gate trench portion 40, the electric field strength at the end portions of the extending portions 39 can be reduced. At the connecting portion 41 of the gate trench portion 40, the gate metal layer 50 may be connected to the gate conductive portion 44.

The dummy trench portions 30 are arrayed at a predetermined interval along a predetermined array direction (the X-axis direction in the present example), as with the gate trench portion 40. At least a part of the dummy trench portion 30 of the present example may be formed in a curve shape, as with the gate trench portion 40. The dummy trench portion 30, by way of example, may have a U shape on the front surface 21 of the semiconductor substrate 10. That is, the dummy trench portion 30 may include two extending portions 29, which extend along the extending direction, and the connecting portion 31, which connects two extending portions 29.

Note that, although one dummy trench portion 30 is provided between gate trench portions 40 in the transistor portion 70 here, the quantity and the arrangement of the dummy trench portions 30 relative to the gate trench portion 40 may be set according to design reasons. Also, the transistor portion 70 may have a namely full gate configuration where the gate trench portions 40 are all provided, without any of the dummy trench portion 30.

The emitter electrode 52 is formed above the gate trench portion 40, the dummy trench portion 30, the well region 11, the emitter region 12, the base region 14, and the contact region 15. The emitter electrode 52 is set to an emitter potential. The emitter potential may be, by way of example, a grounded potential.

The well region 11 is the region, of the second conductivity type, provided on the front surface 21 side of the semiconductor substrate 10 relative to the drift region 18, which will be described below. The well region 11 is one example of the well region provided on the edge side of the semiconductor device 100. The well region 11 is of P+ type, by way of example. The well region 11 is formed within a predetermined range from the end portion of the active region on the side where the gate metal layer 50 is provided. The diffusion depth of the dopant in the well region 11 may be set greater than the depth of the gate trench portion 40 and the dummy trench portion 30. The gate trench portion 40 and the dummy trench portion 30 on the side of the gate metal layer 50 are partly formed in the well region 11. The end portion in the extending direction of the gate trench portion 40 and the dummy trench portion 30 may be covered in the well region 11 at the bottom portion in the depth direction of each of the trench.

The contact hole 54 is formed above each region of the emitter region 12 and the contact region 15 in the transistor portion 70. Also, the contact hole 54 is formed above a second mesa portion 62 in the diode portion 80. The contact hole 54 is not provided above the base region 14 provided on both ends in the Y-axis direction and the well region 11. In this manner, one or more contact holes 54 are formed in the interlayer dielectric film. The one or more contact holes 54 may be provided to extend in the extending direction.

The first mesa portion 61 and the second mesa portion 62 are the mesa portions which are provided in direct contact with each trench portion in the X-axis direction, within a surface which is parallel to the front surface 21 of the semiconductor substrate 10. When the extending portion of each trench portion is taken as one trench portion, the mesa portion refers to the portion, of the semiconductor substrate 10, interposed between two neighboring trench portions. That is, the region interposed between two extending portions of neighboring trench portions may be taken as the mesa portion. In addition, the depth of the mesa portion may be the portion from the front surface 21 of the semiconductor substrate 10 to the depth of the deepest bottom portion of each trench portion.

The first mesa portion 61 is provided in direct contact with at least one of the dummy trench portion 30 and the gate trench portion 40 in the transistor portion 70. Also, the first mesa portion 61 is provided in direct contact with the dummy trench portion 30 in the boundary portion between the transistor portion 70 and the diode portion 80. The first mesa portion 61 has the well region 11, the emitter region 12, the base region 14, and the contact region 15 on the front surface 21 of the semiconductor substrate 10. In the first mesa portion 61, the emitter region 12 and the contact region 15 are provided alternately in the extending direction.

The second mesa portion 62 is provided in direct contact with the dummy trench portion 30 in the diode portion 80. The second mesa portion 62 has the well region 11, the emitter region 12, the base region 14, and the contact region 15 on the front surface 21 of the semiconductor substrate 10. In the second mesa portion 62, the emitter region 12 and the contact region 15 are provided alternately in the extending direction.

The base region 14 is the region of the second conductivity type provided on the front surface 21 side of the semiconductor substrate 10 in the transistor portion 70. The base region 14, by way of example, is of P-type. The base region 14 may be provided on both end portions in the Y-axis direction of the first mesa portion 61 and the second mesa portion 62, on the front surface 21 of the semiconductor substrate 10. Note that, FIG. 1A only shows one end portion in the Y-axis direction of the base region 14.

A base region 14-*e* is arranged on both end portions in the Y-axis direction of each mesa portion. The base region 14-*e* of the present example is provided in the first mesa portion 61 and the second mesa portion 62. The base region 14-*e* is in contact with the contact region 15 on the central side of each mesa portion. The base region 14-*e* is in contact with the well region 11 on the side opposite to the contact region 15.

The emitter region 12 is provided in contact with the gate trench portion 40 on the front surface 21 of the first mesa portion 61. The emitter region 12 may be provided, in the X-axis direction, from one of two trench portions, which extend in the Y-axis direction with the first mesa portion 61 interposed therebetween, to the other of them. The emitter region 12 is also provided below the contact hole 54.

In addition, the emitter region 12 may or may not be in contact with the dummy trench portion 30. In the present example, the emitter region 12 is in contact with the dummy trench portion 30. The emitter region 12 of the present example is of the first conductivity type. The emitter region 12 of the present example, by way of example, is of N+ type.

The contact region 15 is a region of the second conductivity type with a doping concentration higher than the base region 14. The contact region 15 of the present example, by way of example, is of P+ type. The contact region 15 may be provided in the X-axis direction from one of two trench portions extending in the Y-axis direction to the other. The contact region 15 may be provided in both the first mesa portion 61 and the second mesa portion 62. The contact region 15 may or may not be in contact with the gate trench portion 40. Also, the contact region 15 may or may not be in contact with the dummy trench portion 30. The contact region 15 is also provided below the contact hole 54.

The cathode region 82 is the region, of the first conductivity type, provided on the back surface side of the semiconductor substrate 10 in the diode portion 80. The cathode region 82 of the present example is of N+ type, by way of example. The region provided with the cathode region 82 in a planar view is indicated by a dashed line.

Figure 1B:
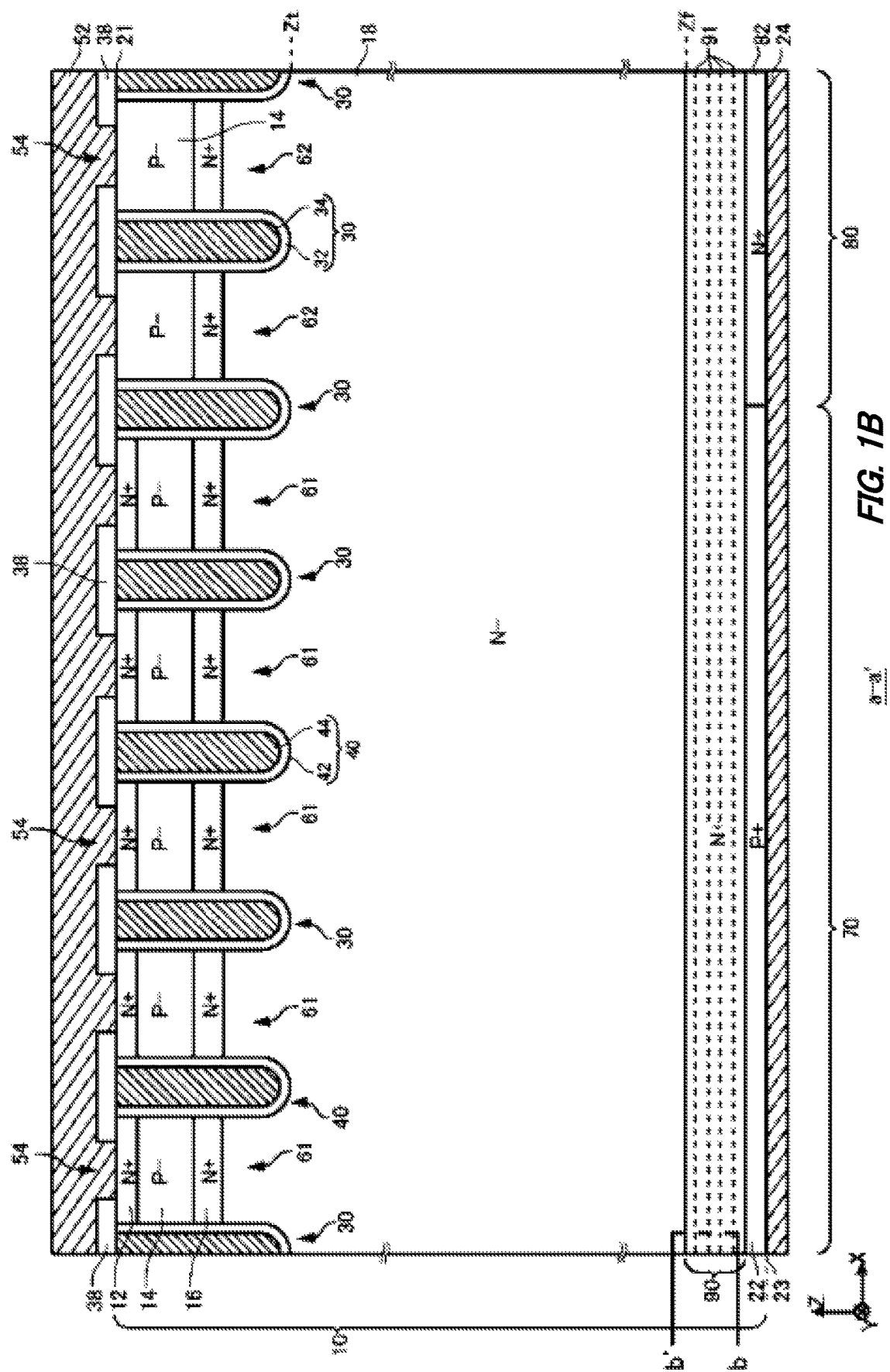
FIG. 1B is a drawing showing one example of the cross-section a-a' in FIG. 1A.

FIG. 1B is a drawing showing one example of the cross-section a-a' in FIG. 1A. The cross-section a-a' is the X-Z plane which passes through the emitter region 12, the base region 14, and the contact region 15 in the transistor portion 70 and the diode portion 80. In the cross-section a-a', the semiconductor device 100 of the present example has the semiconductor substrate 10, the interlayer dielectric film 38, the emitter electrode 52, and the collector electrode 24. The emitter electrode 52 is formed on the front surface 21 of the semiconductor substrate 10 and on the front surface of the interlayer dielectric film 38.

The drift region 18 is a region of the first conductivity type provided on the semiconductor substrate 10. The drift region 18 of the present example is of N− type, by way of example. The drift region 18 may be the remained region without other doping regions formed in the semiconductor substrate 10. In other words, the doping concentration of the drift region 18 may be the doping concentration of the semiconductor substrate 10.

The buffer region 90 is the region of the first conductivity type provided below the drift region 18. The buffer region 90 of the present example is of N type, by way of example. The doping concentration of the buffer region 90 is higher than the doping concentration of the drift region 18. The buffer region 90 may function as a field stop layer to prevent a depletion layer, expanded from the back surface side of the base region 14, from reaching the collector region 22 of the second conductivity type and the cathode region 82 of the first conductivity type.

The upper surface of the buffer region 90 is provided in a depth Zf position from the front surface 21 of the semiconductor substrate 10 in the depth direction of the semiconductor substrate 10, by way of example. The buffer region 90 of the present example has a plurality of peaks 91. The plurality of peaks 91 is formed by plural times of proton ion implantations into the semiconductor substrate 10, by way of example The collector region 22 is a region of the second conductivity type provided on the back surface side of the semiconductor substrate 10 in the transistor portion 70. The collector region 22 is of P+ type, by way of example. The collector region 22 of the present example is provided below the buffer region 90.

The cathode region 82 is a region of the first conductivity type provided on the back surface side of the semiconductor substrate 10 in the diode portion 80. The cathode region 82 is of N+ type, by way of example. The cathode region 82 of the present example is provided below the buffer region 90.

The collector electrode 24 is provided on the back surface 23 of the semiconductor substrate 10. The collector electrode 24 is formed of a conductive material such as metal.

An accumulation region 16 is a region of the first conductivity type provided above the drift region 18. The accumulation region 16 of the present example is of N type, by way of example. The accumulation region 16 is provided in contact with the gate trench portion 40. The accumulation region 16 may or may not be in contact with the dummy trench portion 30. The doping concentration of the accumulation region 16 is higher than the doping concentration of the drift region 18. By providing the accumulation region 16, the carrier injection enhancement effect (Injection Enhancement Effect; IE effect) can be improved to reduce the ON voltage of the transistor portion 70.

The base region 14 is a region of the second conductivity type provided above the accumulation region 16. The base region 14 is provided in contact with gate trench portion 40. The base region 14 is of P− type, by way of example The emitter region 12 is provided between the base region 14 and the front surface 21, in the first mesa portion 61. The emitter region 12 is provided in contact with the gate trench portion 40. The emitter region 12 may or may not be in contact witht the dummy trench portion 30. The doping concentration of the emitter region 12 is higher than the doping concentration of the drift region 18. One example of the dopant of the emitter region 12 is arsenic (As) or phosphorous (P). Note that, the emitter region 12 may not be provided in the second mesa portion 62.

The contact region 15 is provided above the accumulation region 16. The contact region 15 of the present example is provided in contact with the gate trench portion 40. The contact region 15 is of P+ type, by way of example One or more gate trench portions 40 and one or more dummy trench portions 30 are provided at the front surface 21. Each trench portion is provided from the front surface 21 to the drift region 18. In the region where at least any of the emitter region 12, the base region 14, the contact region 15, and the accumulation region 16 is provided, each trench portion also penetrates these regions to reach the drift region 18. The configuration of the trench portion penetrating the doping region is not limited to the one manufactured in the order of forming a doping region and then forming a trench portion. The configuration of the trench portion penetrating the doping region includes the configuration of forming the trench portion and then forming the doping region between the trench portions.

The gate trench portion 40 has the gate trench, a gate dielectric film 42 and a gate conductive portion 44, formed on the front surface 21. The gate dielectric film 42 is formed to cover the inner wall of the gate trench. The gate dielectric film 42 may be formed by oxidizing or nitriding the semiconductor on the inner wall of the gate trench. The gate conductive portion 44 is formed on the inner side than the gate dielectric film 42 inside the gate trench. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 on the front surface 21.

The dummy trench portion 30 and the gate trench portion 40 are provided such that they have a depth Zt from the front surface 21 of the semiconductor substrate to the bottom portion of each trench portion in the depth direction of the semiconductor substrate 10, by way of example. Note that, the depth in which the bottom portion of each trench portion is provided may vary according to the design.

The gate conductive portion 44 includes a region opposing to the base region 14 adjacent on the first mesa portion 61 side, with the gate dielectric film 42 being interposed therebetween, in the depth direction of the semiconductor substrate 10. If a predetermined gate voltage is applied to the gate conductive portion 44, a channel is formed at the surface layer of the interface of the base region 14 in contact with the gate trench by an electron inversion layer.

The dummy trench portion 30 may have the same structure as the gate trench portion 40. The dummy trench portion 30 includes the dummy trench, a dummy dielectric film 32, and a dummy conductive portion 34, formed on the front surface 21 side. The dummy dielectric film 32 is formed to cover the inner wall of the dummy trench. The dummy conductive portion 34 is formed on the inner side than the dummy dielectric film 32 and formed inside the dummy trench. The dummy dielectric film 32 insulates the dummy conductive portion 34 from the semiconductor substrate 10. The dummy trench portion 30 is covered by the interlayer dielectric film 38 on the front surface 21.

The interlayer dielectric film 38 is provided above the front surface 21 of the semiconductor substrate 10. The interlayer dielectric film 38 is provided with one or more contact holes 54 for electrically connecting the emitter region 12 and the emitter electrode 52. Similarly, other contact holes 49 and contact holes 54 may be provided such that they penetrate the interlayer dielectric film 38. The emitter electrode 52 is provided above the interlayer dielectric film 38. The dummy conductive portion 34 may be controlled by a potential which is different from the gate conductive portion 44. By way of another example, the dummy conductive portion 34 is connected to the emitter electrode 52 via the contact hole 54 and set to an emitter potential.

Figure 1C:
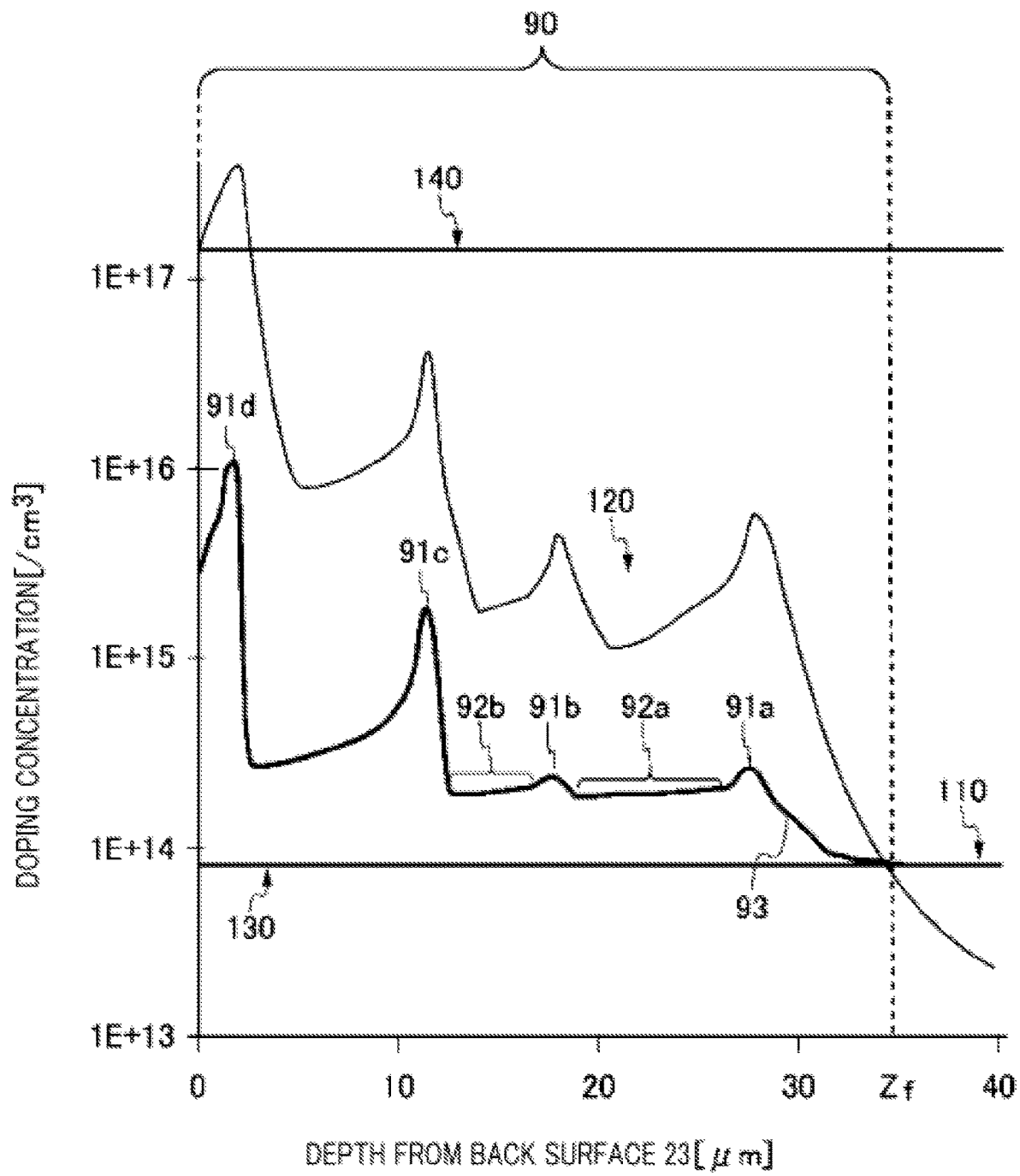
FIG. 1C shows one example of the doping concentration profile of the semiconductor device 100 according to the example embodiment.

FIG. 1C shows one example of the doping concentration profile in the buffer region 90 of the semiconductor device 100 according to the example embodiment. In the graph of the present example, the vertical axis represents the doping concentration [cm$^3$], the horizontal axis represents the depth from the back surface 23 [μm], the negative side of the horizontal axis represents the deeper depth position of the semiconductor substrate 10 relative to the positive side of the horizontal axis. The graph of the present example is a semilog graph where the scale of vertical axis is represented in the logarithm scale. The doping concentration profile of the graph of the present example is a profile drawn of the cross-section b-b' of FIG. 1B.

A doping concentration profile 110 shows the doping concentration profile of the buffer region 90. The buffer region 90 of the present example includes a plurality of peaks 91, a flat part 92, and a gentle gradient region 93.

The plurality of peaks 91 is provided on the back surface 23 side of the semiconductor substrate 10. The plurality of peaks 91 sequentially includes a peak 91a, a peak 91b, a peak 91c, and a peak 91d in the depth direction from the front surface 21 side.

The peak 91a is one example of the first peak provided closest to the front side of the front surface 21 of the semiconductor substrate 10 among the plurality of peaks 91. For example, the depth position of the peak 91a is no less than 25 μm and no more than 35 μm. By reducing the doping concentration variation between the plurality of peaks 91 and the flat part 92, the oscillation with a voltage value in the case where a short circuit occurred between the collector electrode 24 and the emitter electrode 52 can be suppressed. Especially, by reducing the doping concentration variation between the peak 91a, wherein the depth position is shallow in the buffer region from the front surface of the semiconductor substrate 10, and the flat part 92, it becomes easier to suppress the oscillation. For example, doping concentration of the peak 91a is less than or equal to twice the doping concentration of the flat part 92.

The peak 91b is one example of the second peak provided in the second depth position from the front surface 21 side of the semiconductor substrate 10 among the plurality of peaks 91. For example, the doping concentration of the peak 91b is less than or equal to twice the doping concentration of the flat part 92.

The peak 91c is one example of the third peak provided in the third depth position from the front surface 21 side of the semiconductor substrate 10 among the plurality of peaks 91. The doping concentration of the peak 91c may be greater than that of the peak 91a and the peak 91b.

The peak 91d is one example of the fourth peak provided on the fourth depth position from the front surface 21 side of the semiconductor substrate 10 among the plurality of peaks 91. The doping concentration of the peak 91d may be greater than that of the peak 91a, the peak 91b and the peak 91c.

The flat part 92 is provided between the plurality of peaks 91 in the depth direction of the semiconductor substrate 10. The flat part 92 of the present example includes a flat part 92a and a flat part 92b. The flat part 92 is the region having an approximately flat or substantially flat doping concentration profile approximately.

The doping concentration distribution in a predetermined region being "flat" refers to, by way of example, a case where a variation range of the doping concentration distribution in the region is less than or equal to 30% of the average value of the concentrations on both ends of the region. When the doping concentration fluctuates within this range, the distribution in the region shown in the graph may be regarded as being flat. The above-mentioned rate may be less than or equal to 20%, or may be less than or equal to 10%. The variation range of the concentration distribution is a difference between the maximum value and the minimum value of the doping concentration in the region.

The flat part 92a is provided between the peak 91a and the peak 91b. The flat part 92a is one example of the first flat part.

The flat part 92b is provided between the peak 91b and the peak 91c. The flat part 92b is an example of the second flat part. The flat part 92b has a doping concentration which is different from the flat part 92a. For example, the doping concentration of the flat part 92b is within ±10% of the doping concentration of the flat part 92a. The flat part 92 may have a doping concentration more than or equal to 2.5 times the substrate concentration of the semiconductor substrate 10. Also, the flat part 92 may have a doping concentration less than or equal to ten times, and may have a doping concentration less than or equal to five times the substrate concentration of the semiconductor substrate 10.

The gentle gradient region 93 is a region where the doping concentration gradient in the depth direction is gentler than the peak 91a. A gentle gradient region 93 is provided closer to the front surface 21 side of the semiconductor substrate 10 than the peak 91a.

A slope α of the gentle gradient region 93 may be expressed using a semilog slope. Let the position of one end of a predetermined region be x1 [cm], and the position of the other end be x2 [cm]. Let the doping concentration in x1 be N1 [/cm$^3$], and the doping concentration in x2 be N2 [/cm$^3$]. A semilog slope α [/cm] in a predetermined region is defined as α=(log$_{10}$(N2)−log$_{10}$ (N1))/(x2−x1). Here, the numerator of α includes a logarithm and is dimensionless. The slope α of the doping concentration in the gentle gradient region 93 is no less than 750 and no more than 1500. For example, the thickness of the gentle gradient region 93 is no less than 5 μm and no more than 10 μm. By setting the thickness of the gentle gradient region 93 more than or equal to 5 μm, it becomes easier to reduce the surge voltage.

As the indicator of the slope of the flat part 92, a semilog slope may be used. Let the position of one end of the flat part 92 be x3 [cm], and the position of the other end be x4 [cm]. Let the concentration in x3 be N3 [cm$^3$], and the concentration in x4 be N4 [cm$^3$]. A semilog slope η [/cm] in the flat part 92 is defined as η=(log$_{10}$(N4)−log$_{10}$(N3))/(x4−x3). The absolute value of the semilog slope η of the linear approximate distribution in the flat part 92 may be no less than 0 and no more than 50, and may be no less than 0 and no more than 30. Furthermore, the absolute value of the semilog slope η of the linear approximate distribution in the flat part 92 may be no less than 0 and no more than 20, and may be no less than 0 and no more than 10.

For example, at least one of doping concentrations of the plurality of peaks 91 is less than or equal to twice the doping concentration of the flat part 92. Also, at least one of doping concentrations of the plurality of peaks 91 may be less than or equal to 1.5 times the doping concentration of the flat part 92. By way of example, the peak 91b, which is closer to the front surface side, may be less than or equal to 1.5 times the doping concentration of the flat part 92, the peak 91c and the peak 91b being adjoined each other to interpose the flat part 92b between them as both sides. Also, by way of another example, at least the peak 91a, which is closer to the front surface side, may be less than or equal to 1.5 times the doping concentration of the flat part 92, the peak 91b and the peak 91a being adjoined each other to interpose the flat part 92a as both sides. Furthermore, the peak 91b on the back surface side may also be less than or equal to 1.5 times the doping concentration of the flat part 92. Thus, while the magnitude of the peak 91 is suppressed, the doping concentration of the whole buffer region 90 can be secured.

Here, if the doping concentration of the peak 91 in the buffer region 90 is increased, a short-circuit oscillation becomes more likely to occur. On the other hand, if the doping concentration in the buffer region 90 itself is lowered, a reach-through is more likely to occur, in some cases.

The semiconductor device 100 of the present example can secure the integrated concentration of dopant while suppressing the slope of the doping concentration in the whole buffer region 90, by increasing the doping concentration of the flat part 92 while suppressing the doping concentration of the peak 91. Thus, the semiconductor device 100 can suppress the reach-through while suppressing the short-circuit oscillation at a low collector-emitter voltage.

The integrated concentration of dopant from the rise on the back surface side of the substrate concentration to the end portion on the back surface side of the flat part 92b may be no less than 0.8×10 cm$^{-2}$ and no more than 5.0×10 cm$^{-2}$, may be no less than 1.0×10 cm$^{-2}$ and no more than 4.0×10 cm$^{-2}$, and may be no less than 2.0×10 cm$^{-2}$ and no more than 3.0×10 cm$^{-2}$.

The hydrogen chemical concentration profile 120 shows the profile of the hydrogen chemical concentration in the semiconductor device 100. The depth of the peak of the hydrogen chemical concentration profile 120 corresponds to the position of plurality of peaks 91 in the depth direction. In other words, the doping concentration profile is formed by the proton ion implantation.

The substrate concentration profile 130 shows the doping concentration of the semiconductor substrate 10 (that is, the substrate concentration). The substrate concentration of the semiconductor substrate 10 may be no less than 1×10$^{12}$ cm$^{-3}$, and may be no less than 1×10$^{13}$ cm$^{-3}$. The substrate concentration of the semiconductor substrate 10, for example, is 7×10$^{13}$ cm$^{-3}$.

The oxygen chemical concentration profile 140 shows the profile of the oxygen chemical concentration in the semiconductor substrate 10. The oxygen chemical concentration profile 140 of the present example is substantially constant in the depth direction of the semiconductor substrate 10. For example, the oxygen chemical concentration in the buffer region 90 is no less than 1×10$^{17}$ cm$^{-3}$ and no more than 6×10$^{17}$ cm$^{-3}$. By setting the oxygen chemical concentration in the buffer region 90 no less than 1×10$^{17}$ cm$^{-3}$ and no more than 6×10$^{17}$ cm$^{-3}$, it becomes easier to adjust the doping concentration of the flat part 92.

Unlike the doping concentration distribution, the hydrogen chemical concentration distribution of the flat part 92 is not flat. The hydrogen chemical concentration distribution of the flat part 92 decreases in the concentration in a position between neighboring peaks 91 and has a valley portion. Unlike the doping concentration distribution, the hydrogen chemical concentration distribution of the flat part 92 is flat for the following reasons. When the hydrogen ion was implanted from the back surface side so as to form the peak 91 portion, the stop portion of the hydrogen ion becomes the peak 91 portion, and the back surface side relative to the stop portion becomes the passing portion of the hydrogen ion. In the passing portion, a lattice defect made up mostly of vacancies is formed. The concentration distribution of the vacancies forming this lattice defect becomes approximately flat. By heat treatment, hydrogen terminates the dangling bond resulting from vacancies. For this reason, the VOH defect (the hydrogen donor) is also substantially formed flat. Furthermore, the oxygen chemical concentration in the present example is no less than 1×10$^{17}$ cm$^{-3}$ and no more than 6×10$^{17}$ cm$^{-3}$. Thus, the concentration of the VOH defect (the hydrogen donor) of the flat part distributes with a concentration higher than the concentration of the semiconductor substrate.

Note that, in the semiconductor substrate 10, carbon may be included. For example, the carbon chemical concentration in the buffer region 90 is no less than $1\times10^{13}$ cm$^3$ and no more than $3\times10^{16}$ cm$^{-3}$. Also, the carbon chemical concentration in the buffer region 90 may be no less than $1\times10^{13}$ cm$^{-3}$ and no more than $1\times10^{16}$ cm$^{-3}$.

The position of the flat part 92 may be provided in a deeper position relative to the back surface 23, and may be provided on the back surface side relative to the peak of the hydrogen chemical concentration. Thus, the integrated concentration of dopant of the whole buffer region 90 can be increased. Also, the flat part 92 has the VOH defect as a composition. Furthermore, the flat part 92 may have a defect complex, including two or more of lattice defects including a vacancy (such as V, and VV), C, O, and H.

In addition, the total thickness of the flat part 92 may be set larger than the thickness of the semiconductor substrate 10 below the flat part 92. In this way, because the rate, of the region where the doping concentration is constant on the front surface 21 side in the buffer region 90, increases, and it becomes easier to reduce the surge voltage and it becomes easier to increase the integrated concentration of dopant while suppressing the peak concentration.

Figure 2:
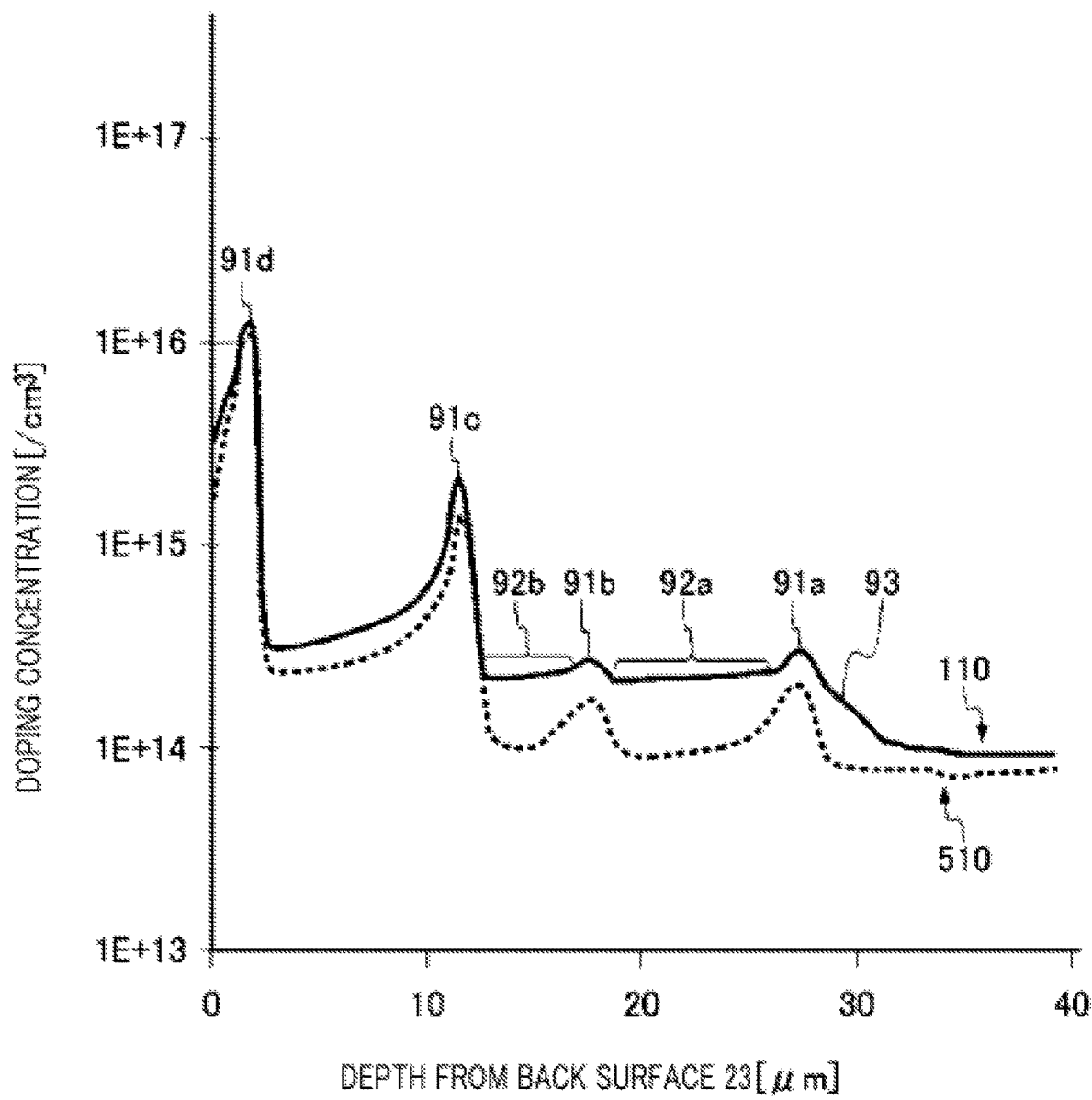
FIG. 2 shows one example of the doping concentration profiles of the example embodiment and a comparative example.

FIG. 2 shows one example of the doping concentration profiles of the example embodiment and the comparative example. The vertical axis represents the doping concentration [/cm$^3$] and the horizontal axis represents the depth [μm] from the back surface 23. The graph of the present example shows the doping concentration profile 110 of the example embodiment and the doping concentration profile 510 of the comparative example. In the present example, cases where different substrates are provided with the buffer region 90 under the same manufacturing condition are compared.

The doping concentration profile 110 is the same one as the doping concentration profile 110 in FIG. 1C. The doping concentration profile 110 represents the concentration profile of the doping concentration in the case where the MCZ substrate is used as the semiconductor substrate 10.

The doping concentration profile 510 represents the concentration profile of the doping concentration in the case where the FZ substrate is used as the semiconductor substrate. As with the peak 91 of the doping concentration profile 110, the peak of the doping concentration profile 510 is formed by the proton ion implantation into the buffer region 90 of the semiconductor substrate 10.

Using the MCZ substrate, the semiconductor substrate 10 grows by the crystal growth in a quartz (SiO2) crucible which uses a carbon heater. Therefore, when compared to the FZ substrate, the whole oxygen chemical concentration and carbon chemical concentration are higher. Accordingly, is is easier for doping concentration profile 110 to provide a higher doping concentration than the doping concentration profile 510, as a whole.

In the doping concentration profile 510, because the whole doping concentration is low, it becomes easier for the depletion layer to reach the collector electrode 24 upon switching. Thus, reach-through current is easy to occur.

Although the doping concentration profile 110 and the doping concentration profile 510 are different in the type of the semiconductor substrate, other conditions, such as the condition of implanting dopant, are the same. The peak of doping concentration profile 110 of the present example is reduced relative to the doping concentration profile 510.

Figure 3:
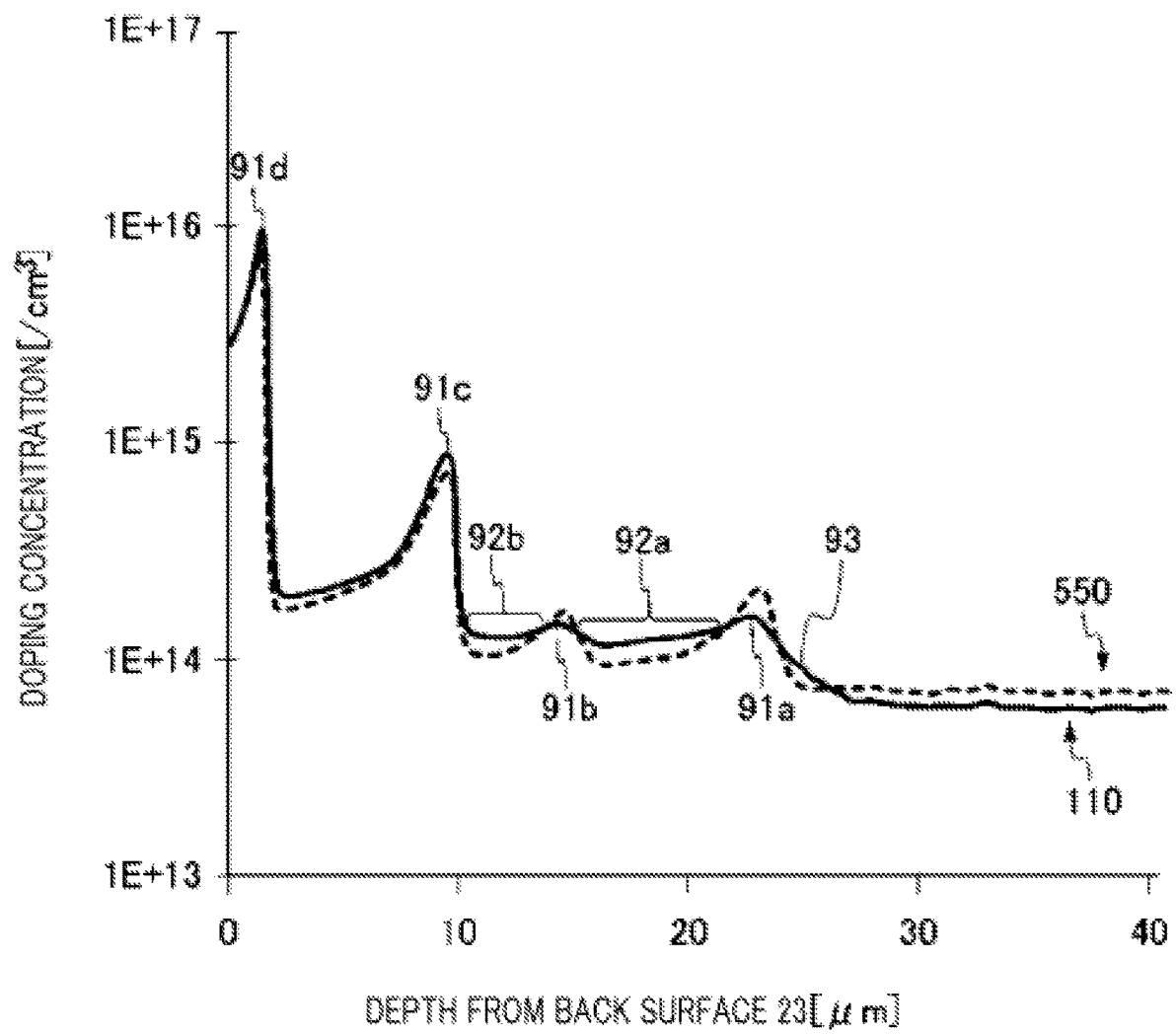
FIG. 3 shows another example of the doping concentration profiles of the example embodiment and the comparative example

FIG. 3 shows another example of the doping concentration profiles of the example embodiment and the comparative example. The vertical axis represents the doping concentration [/cm$^3$], and the horizontal axis represents the depth [μm] from the back surface 23. The present example shows a case where the condition is controlled such that the integrated concentration, of the buffer region 90, for different substrates becomes the same.

The graph of the present example shows the doping concentration profile 110 of the example embodiment and the doping concentration profile 550 of the comparative example. The doping concentration profile 550 of the comparative example is adjusted such that the integrated concentration of dopant, that is, the total dosage of dopant, is the same as the doping concentration profile 110 of the example embodiment. The comparative example uses the FZ substrate for the semiconductor substrate. The oxygen chemical concentration of the semiconductor substrate of the comparative example is $1\times10^{16}$ cm$^{-3}$.

Thus, in the doping concentration profile 110 of the example embodiment, the doping concentration of the flat part 92 becomes higher than the doping concentration of the flat part of the doping concentration profile 550 of the comparative example. Accordingly, in the doping concentration profile 110, the doping concentration of the peak 91 necessary for setting the same integrated concentration can be set small.

Especially, the doping concentration profile 110 shows lower peaks at the first peak 91a and the second peak 91b than the doping concentration profile of the comparative example. The doping concentration profile 110 shows peak values, at the third peak 91c and the fourth peak 91d, slightly higher than the doping concentration profile 550, which results from adjusting the integrated concentration of dopant the same.

The doping concentration profile 110 has a low peak concentration as a whole, and especially provides a low peak concentration at a peak in a shallow depth position of the semiconductor substrate 10, for example the concentration of the first peak 91a and second peak 91b. Thus, a doping concentration profile before the slope for providing the third peak 91c becomes flat, which enables suppressing the short-circuit oscillation.

If the condition where the collector and the emitter of the semiconductor device 100 are short circuited occurs, an oscillation occurs in the gate-emitter voltage in an early stage of the short circuit. Said oscillation breaks the semiconductor device 100 in some cases.

Figure 4:
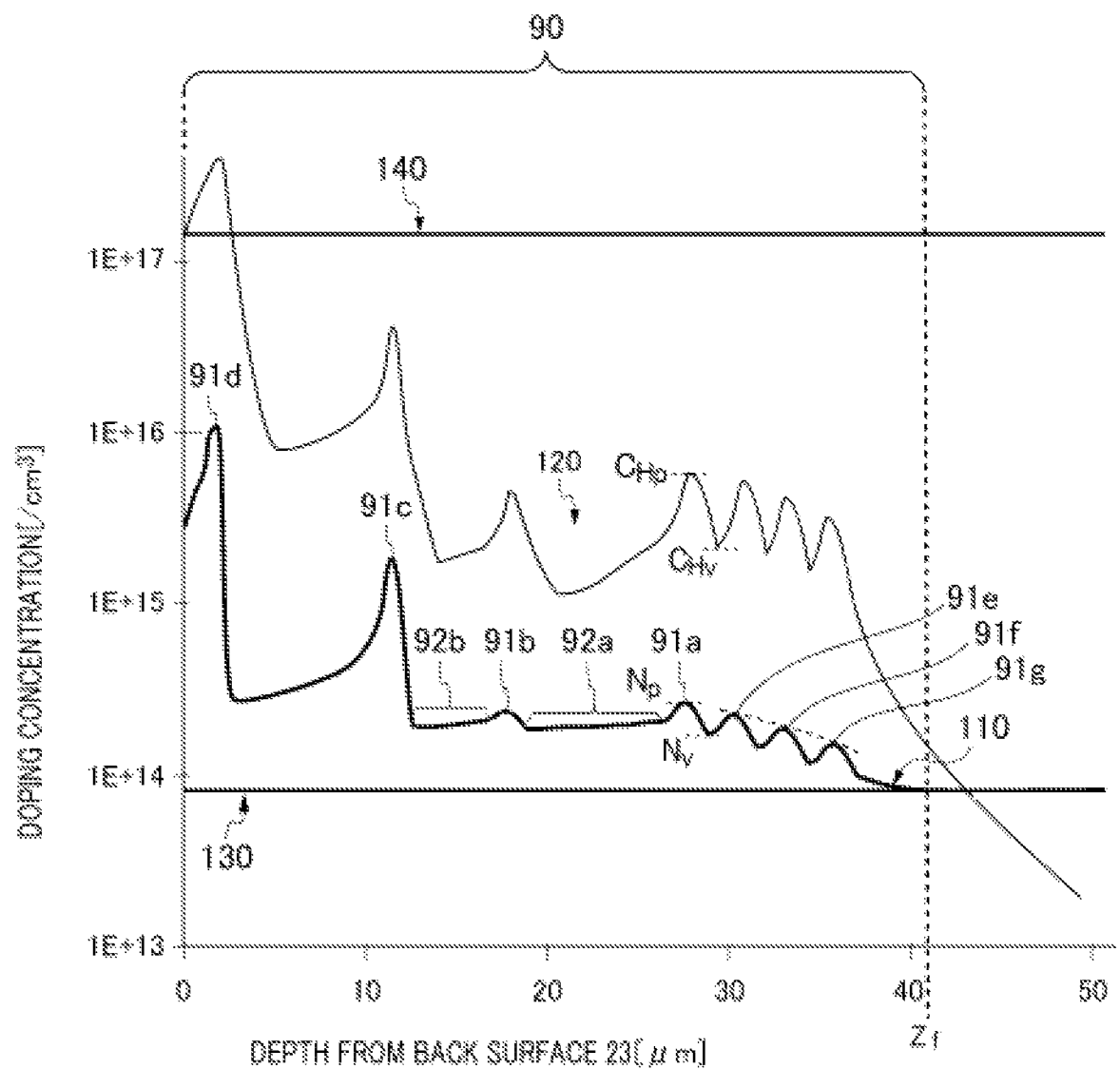
FIG. 4 shows a modification example of the doping concentration profile of the semiconductor device 100 according to the example embodiment.

FIG. 4 shows a modification example of the doping concentration profile in the buffer region 90 of the semiconductor device 100 according to the example embodiment. In the graph of the present example, the vertical axis represents the doping concentration [/cm$^3$], the horizontal axis represents the depth [μm] from the back surface 23, and the negative side of the horizontal axis represents the deeper depth position of the semiconductor substrate 10 relative to the positive side of the horizontal axis. The graph of the present example is a semilog graph, where the scale of the vertical axis is represented in a logarithmic scale. The doping concentration profile of the graph of the present example is a modification example of the profile drawn of the cross-section b-b' of FIG. 1B. In the present example, different points from FIG. 1C are described among others.

The semiconductor device 100 of the present example has a plurality of doping concentration peaks not having a flat region between peaks on the front surface 21 side relative to the flat part 92a. The flat region may be the region where the doping concentration distribution is substantially flat, as with the flat part 92a. A peak 91a, a peak 91e, a peak 91f and a peak 91g are one examples of the plurality of doping concentration peaks provided on the front surface 21 side relative to a flat part 92a. Although the semiconductor device 100 of the present example has four peaks on the front surface 21 side relative to the flat part 92a, the number of peaks on the front surface 21 side relative to the flat part 92a may be two, may be three, and may be five or more.

For the plurality of doping concentration peaks not having a flat region between peaks, a valley portion may be provided individually between peaks. The plurality of doping concentration peaks not having a flat region between peaks does not have a region like the flat part 92. For example, a valley portion is provided between the peak 91a and the peak 91e, between the peak 91e and the peak 91f, and between the peak 91f and the peak 91g. In each valley portion, the gradient of the doping concentration distribution may vary continuously from a negative value to a positive value in the direction from the back surface 23 toward the front surface 21. On the other hand, in the flat part 92, the gradient of the doping concentration distribution may continuously be a value of substantially 0 in the direction from the back surface 23 to the front surface 21. Additionally, the gradient of the doping concentration distribution may be the average value of a plurality of measurement points in a predetermined measuring range, wherein the measurement point is according to the CV method or the srp method, wherein the average value may be a value calculated by well-known fitting.

Additionally, the position in the depth direction of the plurality of doping concentration peaks not having a flat region between peaks corresponds to the position in the depth direction of the hydrogen chemical concentration peak. With regard to the plurality of doping concentration peaks not having a flat region between peaks and the hydrogen chemical concentration corresponding to said plurality of doping concentration peaks, $C_{Hv}/C_{Hp}$ may be smaller than $N_v/N_p$. $C_{Hv}/C_{Hp}$ is the ratio, to a predetermined peak of the hydrogen chemical concentration (e.g., $C_{Hp}$), of a hydrogen chemical concentration in a valley portion adjacent to the peak (e.g., $C_{Hv}$). $N_v/N_p$ is a ratio, to a predetermined peak of the doping concentration (e.g., $N_p$), of a doping concentration of a valley portion adjacent the peak (e.g., $N_v$). $N_v/N_p$ may be set such that the plurality of peaks on the front surface 21 side relative to the flat part 92a drop gradually to the substrate concentration profile 130. $C_{Hv}/C_{Hp}$ may be no more than 0.8 times, may be no more than 0.5 times, may be no more than 0.2 times, may be no more than 0.1 times, and may be no more than 0.01 times of $N_v/N_p$. $C_{Hv}/C_{Hp}$ may be no less than 0.001 times, may be no less than 0.01 times, and may be no less than 0.1 times of $N_v/N_p$.

The semiconductor device 100 having the plurality of peaks not having a flat region between peaks on the front surface 21 side relative to the flat part 92a enables moderating the doping concentration distribution so as to have the change in the electric field intensity moderate when the depletion layer has reached the buffer region 90. In this way, a sudden change in a voltage waveform can be suppressed.

Figure 5:
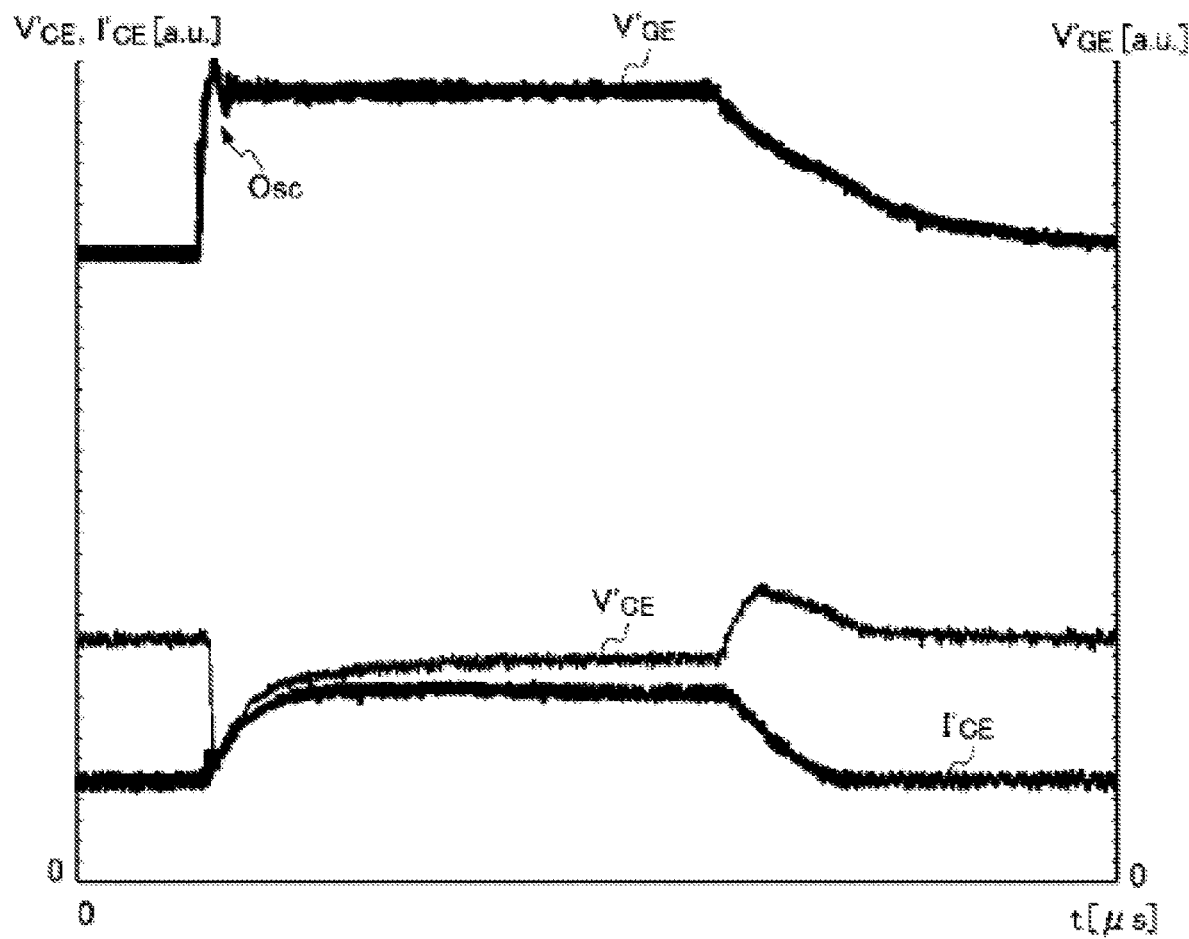
FIG. 5 shows the characteristic of the semiconductor device according to the comparative example in case of short circuit.

FIG. 5 shows the characteristic of the semiconductor device according to the comparative example in case of short circuit. The vertical axis represents current and voltage in an arbitrary unit, and the horizontal axis represents time t [μs]. $V'_{GE}$ refers to the gate-emitter voltage of the semiconductor device according to the comparative example. $V'_{CE}$ refers to the collector-emitter voltage of the semiconductor device according to the comparative example. $I'_{CE}$ refers to the collector-emitter current of the semiconductor device according to the comparative example. In the semiconductor device according to the comparative example, an oscillating point OSc occurs largely in the waveform of $V'_{GE}$ at the point with the low collector-emitter voltage in the early stage of the short circuit.

Figure 6:
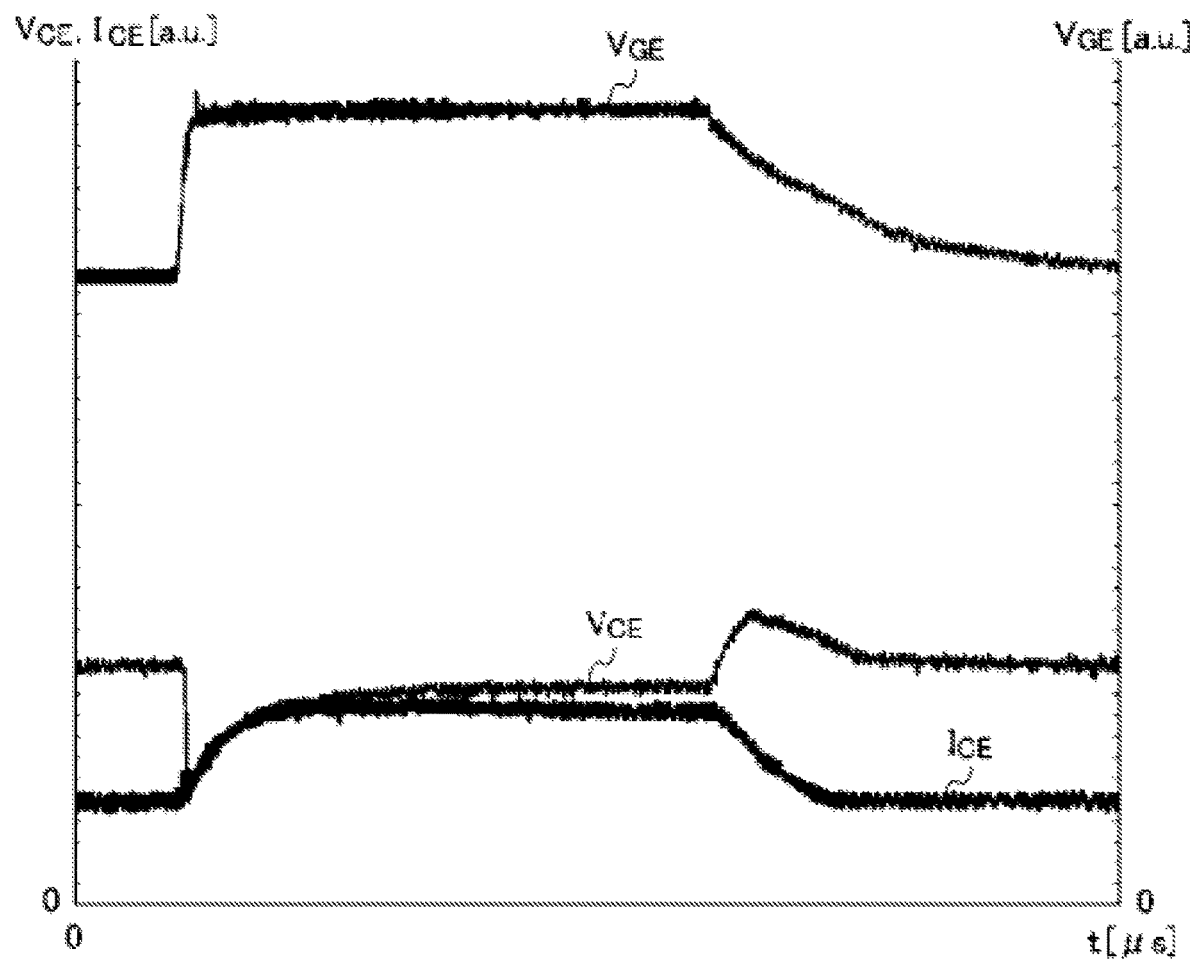
FIG. 6 shows the characteristic of the semiconductor device 100 according to the example embodiment in case of short circuit.

FIG. 6 shows the characteristic of the semiconductor device 100 according to the example embodiment in case of short circuit. The vertical axis represents current and voltage in an arbitrary unit, and the horizontal axis represents arbitrary time t [μs]. $V_{GE}$ refers to the gate-emitter voltage of the semiconductor device 100. $V_{CE}$ refers to the collector-emitter voltage of the semiconductor device 100. $I_{CE}$ refers to the collector-emitter current of the semiconductor device 100. In the semiconductor device 100, a large oscillating point OSc does not occur in the waveform of $V_{GE}$ at a point with a low collector-emitter voltage in the early stage of the short circuit. As it shows, the semiconductor device 100 of the present example can suppress the oscillation of $V_{GE}$ in case of short circuit.

Figure 7:
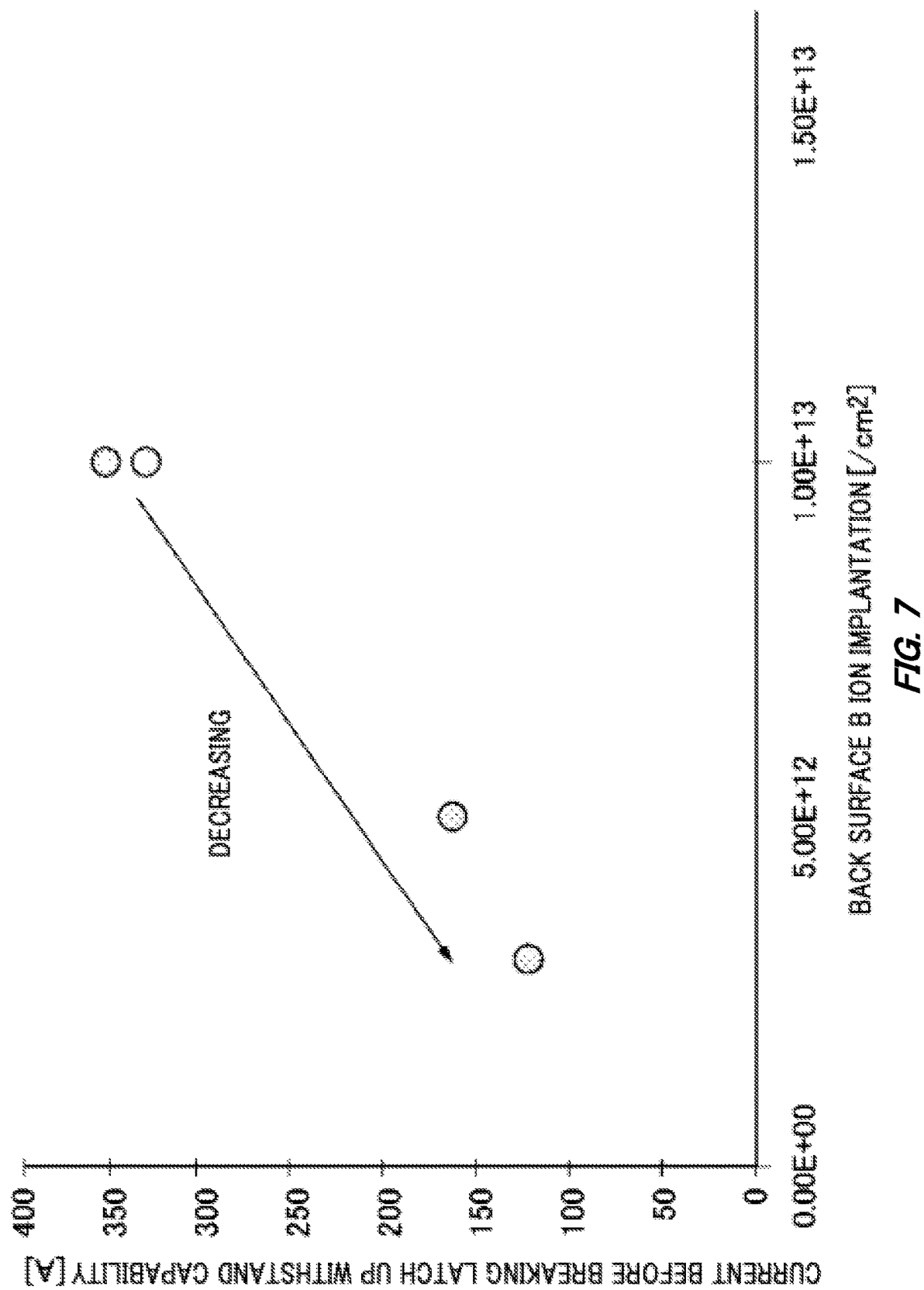
FIG. 7 shows the relationship between a back surface boron ion implantation concentration and a current before breaking latch up withstand capability.

FIG. 7 shows the relationship between a back surface boron ion implantation concentration and the current before breaking latch up withstand capability. A doping concentration peak in the buffer region is formed into a FZ substrate by implanting boron (B) ions from the back surface of the semiconductor substrate. By lowering the back surface boron ion implantation concentration, it becomes easier for the depletion layer to stretch, which deteriorates the latch up withstand capability.

Figure 8:
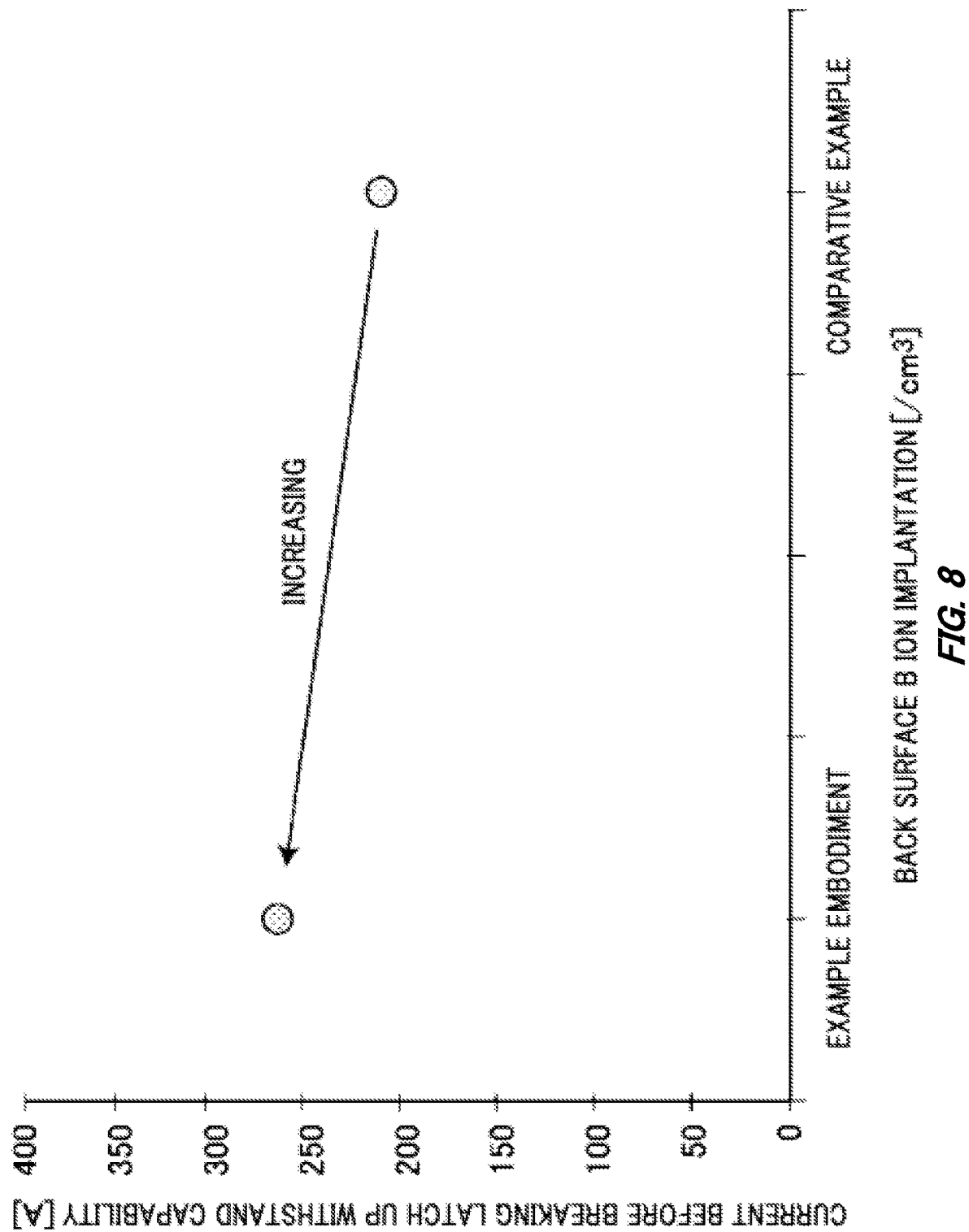
FIG. 8 shows the current before breaking latch up withstand capability in case of short circuit in the example embodiment and the comparative example.

FIG. 8 shows the current before breaking latch up withstand capability in case of short circuit in the example embodiment and the comparative example. In the comparative example, in order to reduce an oscillation in case of short circuit, the amount of implanted hydrogen ion on the back surface 23 side is lowered relative to the peak 91a to attempt to reduce the doping profile concentration. Thus, the integrated doping concentration in the flat part is reduced, which enables the depletion layer stretch easily. Therefore, the current [A] before breaking the latch up withstand capability is also lowered, and a latch-up becomes more likely to occur in the semiconductor device of the comparative example When compared to the comparative example, the current before breaking latch up withstand capability is improved in the semiconductor device 100 of example embodiment shown in FIG. 8. In the semiconductor device 100 of the present example, by reducing the doping concentration of the peak 91 and setting the integrated concentration of the flat part high, the oscillation in case of short circuit can be suppressed while allowing compatibility a high-speed switching by the lowered back surface boron ion implantation concentration as well as providing a sufficient latch up withstand capability.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate
11: well region
12: emitter region
14: base region
15: contact region
16: accumulation region
18: drift region
21: front surface
22: collector region
23: back surface
24: collector electrode
29: extending portion
30: dummy trench portion
31: connecting portion
32: dummy dielectric film
33: dummy conductive portion
34: dummy conductive portion
38: interlayer dielectric film
39: extending portion
40: gate trench portion
41: connecting portion
42: gate dielectric film
44: gate conductive portion
49: contact hole
50: gate metal layer
52: emitter electrode
54: contact hole
56: contact hole
61: first mesa portion
62: second mesa portion
70: transistor portion
80: diode portion
82: cathode region
90: buffer region
91: peak
92: flat part
93: gentle gradient region
100: semiconductor device
110: doping concentration profile
120: hydrogen chemical concentration profile
130: substrate concentration profile
140: oxygen chemical concentration profile
510: doping concentration profile
550: doping concentration profile

What is claimed is:

1. A semiconductor device comprising:
    a semiconductor substrate;
    a plurality of peaks of a doping concentration provided on a back surface side of the semiconductor substrate; and
    a flat part, with a doping concentration more than or equal to 2.5 times a substrate concentration of the semiconductor substrate, provided between the plurality of peaks in a depth direction of the semiconductor substrate,
    wherein at least one of the plurality of peaks is a first peak provided closer to a front surface side than the flat part,
    wherein a doping concentration of the first peak is less than or equal to twice the doping concentration of the flat part.

2. The semiconductor device according to claim 1,
    wherein the doping concentration of the flat part is less than or equal to ten times the substrate concentration of the semiconductor substrate.

3. The semiconductor device according to claim 2,
    wherein a depth position of the first peak is no less than 25 μm and no more than 35 μm.

4. The semiconductor device according to claim 2, comprising
    a gentle gradient region, where a doping concentration gradient in a depth direction is gentler than the first peak, the gentle gradient region being provided closer to a front surface side of the semiconductor substrate than the first peak,
    wherein a slope α of the doping concentration in the gentle gradient region is no less than 750 and no more than 1500,
    wherein a unit of the slope α is [km].

5. The semiconductor device according to claim 4,
    wherein a thickness of the gentle gradient region is no less than 5 μm and no more than 10 μm.

6. The semiconductor device according to claim 1, comprising
    a second peak, wherein the plurality of peaks is the second peak provided in a second depth position from a front surface side of the semiconductor substrate, which is less than or equal to twice the doping concentration of the flat part.

7. The semiconductor device according to claim 1,
    wherein a doping concentration of at least one of the plurality of peaks is less than or equal to 1.5 times the doping concentration of the flat part.

8. The semiconductor device according to claim 1,
    wherein a position in a depth direction of the plurality of peaks corresponds to a depth of a peak of a hydrogen chemical concentration.

9. The semiconductor device according to claim 1,
    wherein the flat part includes:
    a first flat part; and
    a second flat part with a doping concentration different from a doping concentration of the first flat part.

10. The semiconductor device according to claim 9,
    wherein the doping concentration of the second flat part is within ±10% of the doping concentration of the first flat part.

11. The semiconductor device according to claim 9,
    wherein the plurality of peaks sequentially includes a first peak, a second peak, a third peak, and a fourth peak in a depth direction from a front surface side,
    wherein the first flat part is provided between the first peak and the second peak.

12. The semiconductor device according to claim 11,
    wherein the second flat part is provided between the third peak and the fourth peak.

13. The semiconductor device according to claim 9,
    wherein an integrated concentration of dopant from a rising position on a back surface side on the substrate concentration to a end portion of a back surface side of the second flat part is no less than $0.8 \times 10$ $cm^{-2}$ and no more than $5.0 \times 10^{11}$ $cm^{-2}$.

14. The semiconductor device according to claim 1,
    wherein the plurality of peaks is provided in a buffer region,
    wherein an oxygen chemical concentration in the buffer region is no less than $1 \times 10^{17}$ $cm^{-3}$ and no more than $6 \times 10^{17}$ $cm^{-3}$.

15. The semiconductor device according to claim 1, comprising,
a plurality of doping concentration peaks not having a flat region between peaks on the front surface side relative to the flat part.

16. The semiconductor device according to claim 15,
wherein a position in a depth direction of the plurality of doping concentration peaks not having the flat region corresponds to a position in a depth direction of a peak of a hydrogen chemical concentration,
wherein with regard to the plurality of doping concentration peaks not having the flat region and the hydrogen chemical concentration corresponding to the plurality of doping concentration peaks, a ratio of a hydrogen chemical concentration in a valley portion adjacent to a predetermined peak of a hydrogen chemical concentration to the predetermined peak is smaller than a ratio of a doping concentration in a valley portion adjacent to a predetermined peak of a doping concentration to the predetermined peak.

17. The semiconductor device according to claim 1,
wherein the flat part is provided closer to a back surface side than a peak of a doping concentration profile of hydrogen.

18. The semiconductor device according to claim 1,
wherein the flat part includes a defect complex including two or more of a VOH defect or a lattice defect including C, O, and H.

19. The semiconductor device according to claim 1,
wherein a total thickness of the flat part is thicker than a thickness of the semiconductor substrate below the flat part.

20. The semiconductor device according to claim 1,
wherein the semiconductor substrate is a MCZ substrate.

* * * * *